(12) United States Patent
Nagarajan et al.

(10) Patent No.: US 6,716,570 B2
(45) Date of Patent: Apr. 6, 2004

(54) LOW TEMPERATURE RESIST TRIMMING PROCESS

(75) Inventors: Ranganathan Nagarajan, Singapore (SG); Shajan Mathew, Singapore (SG); Lakshmi Kanta Bera, Singapore (SG)

(73) Assignee: Institute of Microelectronics, Singapore (SG)

( * ) Notice: Subject to any disclaimer, the term of this patent is extended or adjusted under 35 U.S.C. 154(b) by 119 days.

(21) Appl. No.: 10/154,280

(22) Filed: May 23, 2002

(65) Prior Publication Data

US 2003/0219683 A1 Nov. 27, 2003

(51) Int. Cl.[7] .......................... G03F 7/36; H01L 21/302
(52) U.S. Cl. ...................... 430/311; 430/313; 430/316; 430/317; 430/318; 430/322; 430/323; 430/328; 216/66; 216/67; 438/709
(58) Field of Search ................. 430/311, 313, 316, 317, 318, 322, 323, 328; 216/66, 67; 438/709

(56) References Cited

U.S. PATENT DOCUMENTS

| | | | | |
|---|---|---|---|---|
| 4,826,756 A | * | 5/1989 | Orvek | 430/328 |
| 5,776,821 A | | 7/1998 | Haskell et al. | 438/585 |
| 5,804,088 A | | 9/1998 | McKee | 216/47 |
| 5,866,473 A | | 2/1999 | Xiang et al. | 438/585 |
| 5,876,903 A | | 3/1999 | Ng et al. | 430/313 |
| 6,010,829 A | | 1/2000 | Rogers et al. | 430/316 |
| 6,121,155 A | | 9/2000 | Yang et al. | 438/725 |
| 6,210,866 B1 | | 4/2001 | Furukawa et al. | 430/313 |
| 6,232,048 B1 | | 5/2001 | Buynoski et al. | 430/328 |
| 6,283,131 B1 | | 9/2001 | Chen et al. | 134/1.2 |
| 2002/0139773 A1 | * | 10/2002 | Gabriel et al. | 216/62 |
| 2003/0168427 A1 | * | 9/2003 | Flamm et al. | 216/2 |

OTHER PUBLICATIONS

Derwent abstract of JP 2003–029417, "Printed wiring board manufacturing method for portable electronic device", Jan. 2003.*

"Deep–Submicrometer MOS Device Fabrication Using a Photoresist–Ashing Technique," by J. Chung et al., (1988), IEEE Electron Device Letters, vol. 9, No. 4, pp. 186–188.

"Fabrication of sub–50–nm gate length n–metal–oxide–semi–conductor field effect transistors and their electrical characteristics," by Mizuki Ono et al., J. Vac. Sci, Technol. B., vol. 13, p. 1740–1743, (1995).

"Gate technology for 0.1–μm Si complementary metal–oxide–semiconductor using g–line exposure and deep ultraviolet hardening," by D.Y. Jeon et al., J. Vac. Sci. Technol. B 12(4), Jul./Aug. 1994, pp. 2800–2804.

* cited by examiner

*Primary Examiner*—Mark F. Huff
*Assistant Examiner*—Nicole Barreca
(74) *Attorney, Agent, or Firm*—George O. Saile; Stephen B. Ackerman

(57) ABSTRACT

A process is described for trimming photoresist patterns during the fabrication of integrated circuits for semiconductor devices and MEMS devices. A combination of a low temperature (<20° C.), high density oxygen and argon plasma and intense UV radiation is used to simultaneously trim and harden a photoresist linewidth in an ICP chamber. As an alternative, a UV hardening step can be performed in a flood exposure tool prior to the ICP plasma etch. Another option is to perform the argon plasma treatment first to harden the resist and then in a second step apply an oxygen plasma to trim the photoresist. Vertical and horizontal etch rates are decreased in a controllable manner which is useful for producing gate lengths in MOS transistors of less than 100 nm. The process can also be used to controllably increase a space width in a photoresist feature.

30 Claims, 2 Drawing Sheets

LOW TEMPERATURE RESIST TRIMMING PROCESS

FIELD OF THE INVENTION

The invention relates to a method of fabricating an integrated circuit in a microelectronic device or MEMS (micro-electromechanical) device. More particularly, the present invention is directed to the method of trimming the linewidth of photoresist which translates after etch transfer to shorter gate lengths in MOS transistors.

BACKGROUND OF THE INVENTION

One of the key steps in the manufacture of a Metal-oxide-semiconductor field effect transistor (MOSFET) is formation of a polysilicon or metal gate. The width of the gate conducting metal is typically one of the smallest dimensions in the device. To satisfy a constant demand for higher performance devices, the gate length or critical dimension (CD) which is actually measured as the width of a metal line is continually being reduced in each successive technology generation. For the 100 nm technology node that is currently being implemented in manufacturing, gate lengths as small as 60 or 70 nm are being produced. One shortcoming of state of the art lithography processes is that they are incapable of controllably printing features in photoresist smaller than about 100 nm. Many semiconductor manufacturers have overcome this problem using a trimming process which laterally shrinks the photoresist line with an etch step.

MOSFETs are typically made by first defining active areas in the substrate by forming isolation regions consisting of insulating material like silicon dioxide. The isolation regions can be generated by local oxidation of silicon (LOCOS) or by a shallow trench isolation (STI) technique. A gate oxide layer is grown over the substrate between the isolation regions. Then a gate electrode material such as polysilicon is deposited and patterned above the gate oxide layer. The gate length is determined by initially patterning a photoresist layer on the gate electrode layer. The openings in the photoresist are transferred through the gate layer by means of a plasma etch. Then ion implantation is used to form source/drain regions which define a channel length under the gate oxide. The final steps in making the device consist of adding sidewall spacers adjacent to the gate electrode, depositing an insulating layer on the substrate and forming contacts to the source/drain regions and to the gate electrodes.

The photoresist material which is patternwise exposed through a reticle can be either positive or negative tone. A positive tone photoresist undergoes a reaction in exposed regions that renders them soluble in a developing solution which is normally aqueous tetrabutyl ammonium hydroxide. Unexposed portions of the photoresist film remain insoluble in the developer. In negative photoresist, exposed regions are crosslinked or become otherwise insoluble in developer while the unexposed portions are washed away in aqueous base solution. Photoresist can be applied as a single layer material or part of a bilayer system. In bilayer applications, the pattern formed in a thin imaging layer is etch transferred through a thicker underlayer that is used for its planarization and anti-reflective properties. In some cases, a single layer photoresist is selected which is very opaque to the incident exposing radiation such that only a top portion near the surface absorbs energy that causes a chemical change to occur. Top surface imaging techniques are frequently combined with a silylation process which forms O—Si bonds selectively in either the exposed or unexposed regions. A subsequent oxygen etch removes photoresist in regions that are not protected by the O—Si bonds in the film. Thermal stability of photoresist features are typically in the range of 90° C. to 150° C. Any processes including plasma etches that involve temperatures in this range or above the thermal stability limit will cause the resist to flow and distort.

The lithography process used to pattern the photoresist above the gate layer generally involves exposure tools which use wavelengths that are selected from a range of 450 nm to sub-200 nm. High throughput projection electron beam tools that have the capability of imaging 50 to 70 nm resist features are still in development and are too expensive to implement. X-ray and ion beam imaging systems have also been used to image photoresist but in general are not found in high volume manufacturing lines. Even with the most advanced exposures tools, phase shift reticles, and resolution enhancement techniques that are currently available in manufacturing, the minimum feature size that can be reliably imaged in a photoresist is about 100 nm. This size is not small enough to meet the demand for sub-100 nm gate lengths for most new devices. As a result, the industry has resorted to other methods that require trimming the pattern in the masking layer that is subsequently etch transferred to form the gate electrode.

The process of accurately and repeatedly etching patterns has been the subject of significant development, especially in the area of semiconductor electronics. The extent to which integrated circuits can be miniaturized depends on the accuracy and reliability of the patterning and etching processes. The etching process involves the use of a mask to selectively allow an etchant to remove underlying semiconductor or conductive material that has been exposed through openings in the mask pattern. Although wet etchants can be employed, a dry plasma etch is usually preferred when the mask is a patterned photoresist layer.

One of the original methods of MOS device fabrication involving gate lengths less than 200 nm is published in IEEE Electron Device Letters, Vol. 9, No. 4, pp. 186–188 (1988) by C. Hu. A plasma etching system with an $O_2$ pressure of 300 mTorr and RF power of 50 Watts was used to laterally trim a photoresist feature before an etch transfer into an underlying polysilicon layer. Oxygen radicals react with elements of C, H, N, and S in the photoresist to form their corresponding oxides such as $CO_2$, $H_2O$, $NO_2$ and $SO_2$ which are swept away in the exhaust stream.

A more recent publication by M. Ono in J. Vacuum. Sci. Tech. B, Vol. 13, 1740–1743 (1995) mentions the use of oxygen plasma ashing to achieve 40 nm gate electrodes. The lateral trimming is about 15 nm/min. and is almost independent of the original photoresist dimension which varies from 216 to 324 nm in width.

Besides the lateral erosion of the photoresist image, some top loss can also occur during the trimming process which is unacceptable if there is not enough resist thickness remaining to serve as a mask for the subsequent etch into the polysilicon layer. The vertical trim rate of a photoresist image can be more than twice as fast as the horizontal trim rate. Jeon et al. in J. Vacuum Science Tech. B, Vol. 12, pp., 2800–2804 (1994), utilize a Deep Ultraviolet (UV) hardening with wavelengths near 300 nm to harden the photoresist after a trimming step and then proceed with etch transfer into an underlying hard mask. The hard mask (silicon nitride) then becomes a mask for etching polysilicon gates. The photoresist in this example is patterned with i-line (365 nm) imaging and contains novolac resin which becomes crosslinked in the hardening mechanism. However, other resists such as those imaged by Deep UV (248 nm) radiation which contain polyvinyl phenol polymers can be crosslinked or hardened as well. The particular wavelengths selected for hardening depend on their absorbance in the photoresist film. A high absorbance will cause a hardening in only the outer skin while a low absorbance will result in too little energy being absorbed by the film and an excessively prolonged hardening process.

In some cases a bottom anti-reflective coating (BARC) is formed on the gate layer prior to the photoresist coating in order to control reflectivity during the photoresist patterning process. This leads to a tighter control of dimensions in the printed pattern. In U.S. Pat. No. 5,804,088, a TiN BARC also functions as a hard mask for the polysilicon etch step. U.S. Pat. No. 6,010,829 describes the use of an organic BARC which is isotropically etched with the photoresist at a 1:1 selectivity. However, BARC layers require extra coating and removal steps that add cost to the manufacturing process. Organic BARC can be difficult to rework and strip since it is generally cured over 200° C.

Other trimming methods found in U.S. Pat. Nos. 5,866,473 and 5,776,821 involve forming an oxide layer on the vertical walls of an etched polysilicon gate. Oxide formation consumes some of the polysilicon and when the oxide is removed the polysilicon gate has a smaller dimension. Again, the formation of an extra layer requires additional formation and removal processes that can add to the overall cost of the device. Preferably, any trimming process can be done with existing materials and equipment to minimize device cost.

Another photoresist hardening method which allows more photoresist thickness to be retained during the etch steps is described in U.S. Pat. Nos. 5,876,903 and 6,232,048. Bombardment with ionized particles with energies of 20 to 100 keV hardens the surface of the photoresist and makes is more resistant to plasma etch. One drawback is that the ion energy and high dose have a tendency to damage the substrate which cannot be easily annealed since the gate is sensitive to high temperatures.

Therefore, an improved photoresist trimming process is needed whereby the vertical etch rate is slowed to allow a significant retention of film thickness that will provide a good mask for the polysilicon etch step while the horizontal process is slowed to allow a good control of the resulting feature size. The process should ideally avoid the formation of extra layers that require additional process steps and add cost to the device.

SUMMARY OF INVENTION

The present invention is a method of preparing reduced photoresist linewidth dimensions during the fabrication of integrated circuits for semiconductor devices, microelectromechanical (MEMS) devices, or other devices that require the formation of patterned features on a substrate.

One objective of the present invention is to provide a means of reducing the linewidth of a photoresist pattern that is used to define a gate length of a gate electrode in a MOSFET device. The lateral trimming of a photoresist feature should be slow enough to allow the reduced feature size to be formed in a controlled and reproducible manner. Preferably, the vertical trimming of the photoresist will be slowed as well to provide enough thickness retention that allows the photoresist to serve as an effective mask during a subsequent etch transfer of the pattern into the underlying substrate.

A further objective of the present invention is to provide a method of reducing the linewidth of a photoresist pattern that does not involve the formation of extra layers or use of new tools that can add to the cost of manufacturing the device.

A still further objective of the present invention is to provide a method of reducing the linewidth or increasing the space width of a photoresist pattern that is subsequently etch transferred through an underlying layer or substrate. The pattern is not restricted to an isolated line but can consist of dense lines and spaces, contact holes, trenches or other commonly used photoresist features.

These objectives are achieved by providing a patterned photoresist layer on a substrate. The photoresist may be positive or negative tone and can be imaged with a variety of radiation sources including electron beam, ultraviolet sources that have a wavelength or wavelengths selected from a range of about 450 nm to below 200 nm, and X-ray sources. The photoresist is selected from a group of materials including single layer photoresist, bilayer imaging systems, or top surface imaging systems.

In one embodiment, the width of the photoresist profile is controllably reduced by cooling the substrate to less than 20° C. while etching in a high density oxygen and argon based plasma. The method further makes use of a low pressure inductively coupled plasma (ICP) wherein the ICP coil power is applied to create a remote high density oxygen and argon rich plasma. The plasma also forms an intense ultraviolet radiation which simultaneously hardens the outer portions of the resist feature while the plasma etches away the photoresist in vertical and horizontal directions. The combination of slow etch rate and UV hardening reduces the vertical etch rate so that an adequate thickness of photoresist is retained to serve as an etch mask for a subsequent etch transfer step into the underlying substrate which is preferably polysilicon. The lateral etch rate is slower than the vertical rate and is in the range of 150 to 200 Angstroms per minute for features smaller than 1 micron in width. This method has been successfully implemented to trim a photoresist line having a 1.2 micron width to one that is only 0.08 microns or 80 nm with vertical sidewalls. The photoresist pattern with reduced linewidth is then etched transferred in an anisotropic manner into an underlying substrate such as polysilicon during the fabrication of a MOSFET device. Any remaining photoresist is stripped by conventional methods.

As an alternative, a UV hardening process is performed prior to the trimming step. A commercially available flood exposure system can be used to apply radiation with selected bandwidths from the 220 to 400 nm range, depending upon the lamp and filter set. Normally, a one to four minute exposure is combined with a thermal treatment of from 100° C. to 240° C. and is sufficient to harden the outer surface of the photoresist feature. The substrate is then subjected to the plasma etch process described in the first embodiment.

In a second embodiment, the photoresist pattern is formed on a substrate or on a hard mask over a substrate as depicted in FIGS. 2a–2c. A space width in a photoresist feature which can be a combination of lines and spaces, contact holes, or trenches becomes larger as the lateral etch from the plasma reduces the photoresist dimension. Simultaneous UV hardening and high density etch in an ICP chamber with oxygen and argon plasma enables a slow etch that minimizes a vertical loss of photoresist while controlling the horizontal component.

The advantages of the embodiments of this invention are that vertical and horizontal etch rates during a photoresist trimming process are controlled. No extra coatings are required. Since the etch and UV hardening can take place in the same chamber, a high throughput process is possible. Furthermore, the low temperature process does not distort the photoresist image.

BRIEF DESCRIPTION OF THE DRAWINGS

FIG. 1a is a cross sectional view of a patterned photoresist on a substrate.

FIG. 1b shows photoresist trimming by means of a plasma etch.

FIG. 1c is a cross sectional view of a substrate after etch transfer of the trimmed photoresist pattern through the underlying polysilicon layer.

FIG. 1d is a cross sectional view of a MOSFET after forming the gate electrode, forming source/drain regions, adding sidewall spacers adjacent to the gate electrode, and forming contacts to the source/drain regions and to the gate.

DETAILED DESCRIPTION OF THE INVENTION

Figure 1A:
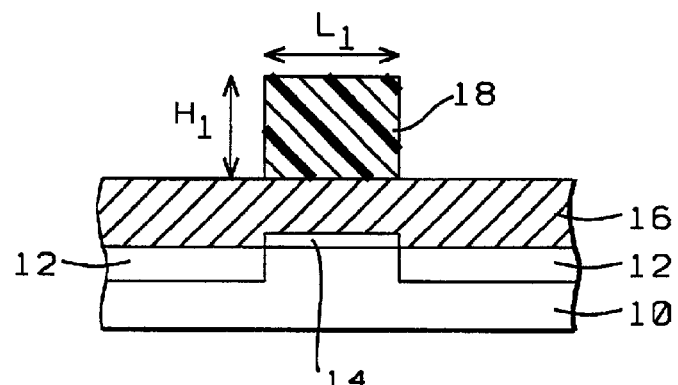
FIGS. 1a–1d depict the various steps of the method for forming a polysilicon gate structure in accordance with an embodiment of the present invention. The structures are not necessarily drawn to scale.

The present invention has been found to be effective in reducing the linewidth of a photoresist feature in a controlled manner and is particularly useful during the formation of gate electrodes in MOSFET for semiconductor or MEMS devices. The method can be applied to trimming the size of a variety of features including isolated lines, dense lines, contact holes and trenches. The invention is not limited to the specific examples described herein.

In the first embodiment, as illustrated in FIGS. 1a–1d, a substrate 10 that is typically silicon with a field implant of an impurity such as boron is provided which has an active area located between two isolation regions 12. Isolation regions can be formed by a LOCOS method or in this case, shallow trench isolation (STI) features 12 are depicted. The STI regions 12 are filled with an insulating material such as silicon dioxide or a low k dielectric material. A gate oxide layer 14 is formed between STI regions 12 by placing substrate 10 in a thermal oxidation furnace where a dry oxygen ambient at approximately 600° C. to 800° C. is used to grow an oxide layer from about 15 to about 100 Angstroms thick. For high performance MOSFETs, a gate oxide thickness of 50 Angstroms or below is preferred. Other methods such as RTO (rapid thermal oxidation) may also be used to grow an oxide layer. A polysilicon layer 16 from about 1300 Angstroms to 2500 Angstroms in thickness is deposited on substrate 10 with a low pressure CVD technique.

In FIG. 1a, a photoresist pattern 18 has been formed on polysilicon layer 16 by a standard lithography method. Depending upon the desired width L1, the photoresist thickness may vary from about 200 nm (0.2 microns) to 1 micron or higher. Normally, the height H1 of the feature is not more than about 3 to 4 times as large as L1 to prevent the feature from collapsing while in the aqueous base developer or subsequent DI water rinse process. The photoresist can be either positive or negative tone and may consist of a single layer, bilayer or top-surface imaging (TSI) system. A bilayer system comprises a thin imaging layer and a thicker under- layer that is selected for its planarizing and anti-reflective properties. Once an image is formed in the top layer, the pattern is etch transferred through the underlayer. A TSI system is normally a single layer material that highly absorbs the imaging radiation such that only a top portion of the layer undergoes a chemical change during exposure. A gas phase silylation is then used to selectively form O—Si bonds in either the exposed or unexposed regions. Then an oxygen RIE method is used to remove regions which do not contain O—Si bonds. Besides silicon reagents, other organometallic compounds can be used to form O—Z bonds where Z is an element whose oxide is resistant to an oxygen etchant.

The exposing radiation used to pattern photoresist 18 is typically ultraviolet light with a wavelength or wavelengths in the range from about 450 nm to below 200 nm. Those skilled in the art recognize that 193 nm exposure tools are being implemented in manufacturing with capability of sub-100 nm imaging. Within a few years, 157 nm exposure systems are projected to have 70 nm imaging capability. Projection electron beam systems with capability to image 50 to 70 nm features are expected to be commercially available in the near future. EUV, X-ray, or ion beam exposures are other examples of radiation sources that could be used in the future to pattern sub-100 nm features in photoresist films. The present invention is not limited to the type of exposure system and is not limited to the size of dimensions H1 and L1 in FIG. 1a.

Historically, there has been a demand for devices with a minimum line or space size that is smaller than the smallest L1 than can be reliably printed with an exposure tool in a manufacturing line. In some cases, IC manufacturers have resorted to advanced illumination techniques including attenuated or alternating phase shift masks to achieve a smaller L1 size. However, these alternatives are quite costly and usually are not capable of achieving the desired feature size, especially for gate lengths.

Figure 1B:
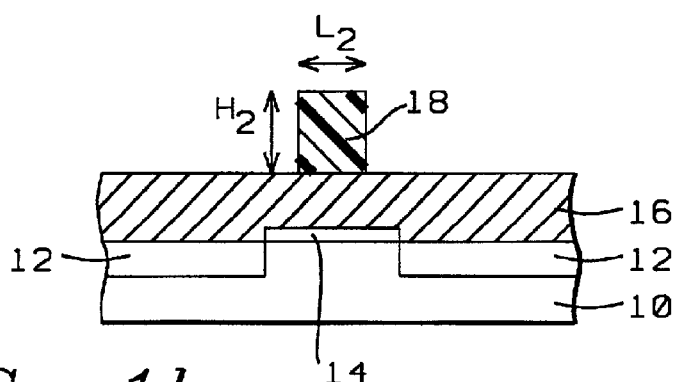

The inventors have discovered a method that can achieve a desired minimum feature size which avoids costly changes in the exposure process. Instead, the improved method makes use of existing etch tools to achieve dimension L2 in photoresist 18 as shown in FIG. 1b that is smaller than L1 which is the smallest feature size that can be printed by lithographic methods. Substrate 10 is placed in an etch chamber which is preferably an ICP (inductively coupled plasma) chamber. The chuck that holds the substrate in place inside the ICP chamber has capability to cool the back side of substrate 10 while plasma etchant is removing photoresist 18 from the front side. The ICP chamber provides independent control over ion flux and ion energy. In this embodiment, the inventors make use of a low pressure inductively coupled plasma wherein an ICP coil power is applied to create a remote high density oxygen and argon rich plasma. This process can work with or without a separate bias power applied to substrate 10.

One of the key features of the present invention is that substrate 10 is cooled to less than 20° C. during the plasma etch. Most prior art examples of photoresist trimming processes use oxygen plasma at low pressure and low power either at room temperature (20° C.–30° C.) or at medium temperature (50° C. to 70° C.). However, the process of etching a photoresist is an exothermic reaction that causes the substrate temperature to rapidly increase and can easily result in photoresist swelling, flow or distortion when L2 reaches dimensions of approximately 100 nm or less.

The low temperature plasma etch slows the etch rate in the horizontal and vertical direction which allows a more controlled and reliable trimming. The slower etch also enables intense UV radiation from the high density plasma to simultaneously harden the photoresist image as it is being trimmed. The hardening mechanism by UV radiation is believed to involve a crosslinking reaction between different polymer chains within the photoresist. For photoresist that has been patterned with wavelengths above 300 nm, a commonly used polymer is novolac resin. Other commonly used photoresists are imaged with 248 nm (Deep UV) radiation and contain polyvinyl phenols that are also easily crosslinked with appropriate radiation. UV hardening of photoresist 18 further retards the etch rate in the ICP chamber.

While oxygen plasma generated from an oxygen flow rate in the range of 5 to 10 sccm can be used alone, the trim rate is lower when oxygen is used in combination with argon at a flow rate of 35 to 65 sccm. The ICP coil power is from 50 to 100 Watts and is preferably 50 Watts. The pressure in the ICP chamber is from 5 to 10 mTorr. Horizontal and vertical etch rates from two recipes are summarized in Table 1 and Table 2 below. Note that the vertical trimming is approximately twice as fast as the horizontal etch rate. In both examples, substrate 10 is cooled to 6.5° C. in the ICP chamber. Vertical trim rate is measured with an ellipsometer and horizontal trim rate is measured with cross sections from a scanning electron microscope (SEM). Using this method, a photoresist 18 having L1=1.2 microns has been trimmed to an L2 dimension of 0.08 microns (80 nm) while maintaining a vertical sidewall on the photoresist profile.

TABLE 1

Vertical Trim Rates in ICP Chamber on Patterned Wafers at 6.5° C.

| Initial Thickness in Angstroms | Final Thickness in Angstroms | Etch Time (min.) | Rate (A/min.) | Recipe |
|---|---|---|---|---|
| 11150 | 9071 | 5 | 415.8 | 5 sccm $O_2$ + 45 sccm Ar |
| 11153 | 7319 | 9 | 426.0 | 5 sccm $O_2$ + 45 sccm Ar |
| 11140 | 8826 | 5 | 462.8 | 5 sccm $O_2$ |
| 11103 | 6981 | 8 | 515.2 | 5 sccm $O_2$ |

TABLE 2

Horizontal Trim Rates in ICP Chamber on Patterned Wafers at 6.5° C.

| Drawn CD (um) | L1 (um) | L2 (um) | Etch Time (min). | Rate (A/min.) | Recipe |
|---|---|---|---|---|---|
| 2 | 1.64 | 1.52 | 5 | 120.0 | 5 sccm $O_2$ |
| 1 | 0.733 | 0.533 | 5 | 200.0 | 5 sccm $O_2$ |
| 0.8 | 0.54 | 0.338 | 5 | 202.0 | 5 sccm $O_2$ |
| 2 | 1.64 | 1.23 | 8 | 256.2 | 5 sccm $O_2$ |
| 1 | 0.733 | 0.259 | 8 | 296.2 | 5 sccm $O_2$ |
| 2 | 1.64 | 1.54 | 5 | 100.0 | 5 sccm $O_2$ + 45 sccm Ar |
| 1 | 0.733 | 0.579 | 5 | 154.0 | 5 sccm $O_2$ + 45 sccm Ar |
| 0.8 | 0.54 | 0.378 | 5 | 162.0 | 5 sccm $O_2$ + 45 sccm Ar |
| 2 | 1.64 | 1.33 | 9 | 172.2 | 5 sccm $O_2$ + 45 sccm Ar |
| 1 | 0.733 | 0.379 | 9 | 196.7 | 5 seem $O_2$ + 45 sccm Ar |
| 0.8 | 0.54 | 0.188 | 9 | 195.6 | 5 sccm $O_2$ + 45 sccm Ar |

Table 1 indicates that the vertical etch rate is about 10 to 20% slower when 45 sccm argon is mixed with 5 sccm oxygen than when oxygen is used alone. Trim rate varies slightly with time but is within acceptable limits. In manufacturing the trim time can be controlled to within a few seconds which maintains the vertical loss to within a tight range. It should be noted that the vertical loss in Table 1 is much less than is observed when substrate 10 is etched at room temperature (20° C. to 30° C.) or above. Therefore, a higher H2 is achieved at low temperature than when operating at room temperature or in the 50° C. to 70° C. range. The photoresist hardening that results from the intense radiation from the high density plasma contributes to a slower vertical etch rate. Even at temperatures of $\leq 20°$ C., a trend can be observed wherein the trim rate increases as temperature increases as shown in Table 3 for unpatterned wafers etched in a Multiplex Inductive Coupled Plasma Etcher from Surface Technology Systems, UK.

TABLE 3

Trim Rate vs. Wafer Temperature on Unpatterned Wafers in $O_2$/Ar Process

| Process Conditions | Temp. (° C.) | Trim Rate (A/min.) |
|---|---|---|
| Coil = 50 W, Bias = 0, 5 sccm $O_2$, 45 sccm Ar, Time = 10 min. | 6 | 379 |
| Coil = 50 W, Bias = 0, 5 sccm $O_2$, 45 sccm Ar, Time = 10 min. | 10 | 399 |
| Coil = 50 W, Bias = 0, 5 scem $O_2$, 45 sccm Ar, Time = 10 min. | 20 | 419 |

Trim rate also increases as coil power increases as shown in Table 4. A coil power of 50 W is preferred since it provides the lowest trim rate.

TABLE 4

Trim Rate vs. Coil Power on Unpatterned Wafers in $O_2$/Ar Process

| Process Conditions | Coil Power | Trim Rate (A/min.) |
|---|---|---|
| Bias = 0, 5 sccm $O_2$, 45 sccm Ar, Temp. = 6° C., Time = 10 min. | 50 W | 379 |
| Bias = 0, 5 sccm $O_2$, 45 sccm Ar, Temp. = 6° C., Time = 10 min. | 100 W | 601 |
| Bias = 0, 5 sccm $O_2$, 45 sccm Ar, Temp. = 6° C., Time = 10 min. | 150 W | 733 |

Oxygen flow rate has a small effect on the trim rate as shown in Table 5. A lower oxygen flow rate provides a slower trim rate.

TABLE 5

Trim Rate vs. Oxygen Flow on Unpatterned Wafers in $O_2$/Ar Process

| Process Conditions | Oxygen Flow | Trim Rate (A/min.) |
|---|---|---|
| Coil = 50 W, Bias = 0, Temp. = 6° C., 45 sccm Ar, t = 10 min. | 5 sccm | 379 |
| Coil = 50 W, Bias = 0, Temp. = 6° C., 45 sccm Ar, t = 10 min. | 10 sccm | 402 |
| Coil = 50 W, Bias = 0, Temp. = 6° C., 45 sccm Ar, t = 10 min. | 15 sccm | 412 |

Another process condition that can be varied is bias power. The photoresist trim rate is increased as bias power becomes larger than zero as seen in Table 6.

TABLE 6

Trim Rate vs. Bias Power on Unpatterned Wafers in $O_2$/Ar Process

| Process Conditions | Bias Power | Trim Rate (A/min.) |
|---|---|---|
| Coil = 50 W, 5 sccm $O_2$, 45 sccm Ar, Temp. = 6° C., t = 10 min. | 0 W | 379 |
| Coil = 50 W, 5 sccm $O_2$, 45 sccm Ar, Temp. = 6° C., t = 10 min. | 10 W | 436 |
| Coil = 50 W, 5 sccm $O_2$, 45 sccm Ar, Temp. = 6° C., t = 10 min. | 15 W | 550 |

The results from an experiment involving unpatterned wafers in which the process time was varied are in agreement with the findings in Table 1 in that there is little change in trim rate with time. Furthermore, the results in Table 7 indicate there is no clear trend in rate vs. time.

TABLE 7

Trim Rate vs. Process Time on Unpatterned Wafers in $O_2$/Ar Process

| Process Conditions | Process Time | Trim Rate (A/min.) |
|---|---|---|
| Coil = 50 W, Bias = 0, 5 sccm $O_2$, 45 sccm Ar, Temp. = 6° C. | 3 min. | 377 |
| Coil = 50 W, Bias = 0, 5 sccm $O_2$, 45 sccm Ar, Temp. = 6° C. | 5 min. | 357 |
| Coil = 50 W, Bias = 0, 5 sccm $O_2$, 45 sccm Ar, Temp. = 6° C. | 7 min. | 369 |
| Coil = 50 W, Bias = 0, 5 sccm $O_2$, 45 sccm Ar, Temp. = 6° C. | 9 min. | 374 |
| Coil = 50 W, Bias = 0, 5 sccm $O_2$, 45 sccm Ar, Temp. = 6° C. | 10 min. | 379 |
| Coil = 50 W, Bias = 0, 5 sccm $O_2$, 45 sccm Ar, Temp. = 6° C. | 11 min. | 370 |
| Coil = 50 W, Bias = 0, 5 sccm $O_2$, 45 sccm Ar, Temp. = 6° C. | 15 min. | 360 |

Starting with a given H1 in FIG. 1a, H2 in FIG. 1b is high enough for gate etch following the method of the present invention. A higher H2 is an advantage in the next step where the photoresist pattern is transferred into the underlying substrate. A sufficient height H3 must remain so that micro grooves which can form in the sidewalls of the photoresist during etch are not transferred into the polysilicon. In addition, imperfections in the photoresist imaging process can generate L1 in FIG. 1a that is not uniform along the length of the line in the z direction (perpendicular to the x-y plane represented by the drawing). This non-uniformity is especially evident near the top of the photoresist 18 where rounding can occur during the aqueous developer step. A general rule is that H3 should be at least 100 nm to prevent irregularities along the top of photoresist 18 from being etch transferred into the polysilicon. As the desired L2 dimension shrinks to near 100 nm or below, a method that preserves thickness H3 will be quite valuable.

Table 2 indicates that the vertical etch rate is about 20 to 30% slower when 45 sccm argon is mixed with 5 sccm oxygen than when oxygen is used alone. A mixture of oxygen and argon is preferred because it results in narrow photoresist profiles that are vertical and uniform. Narrow photoresist lines 18 trimmed with only oxygen plasma have a sloped sidewall where L2 is larger at the top than at the bottom of the image in FIG. 1b. In manufacturing the trim time could be controlled to within a few seconds and dimension L2 could be maintained within a tight linewidth specification. Large lines have a noticeably lower etch rate. In order to minimize (L1–L2) and reduce etch times, the lithography process will usually print L1 smaller than 1 um and in this region, the effect of linewidth L1 on the trim etch rate is fairly small.

Optionally, the trim etch may be divided into two stages. Argon plasma used only for the purpose of UV hardening the photoresist 18 is generated for a period of 3 to 9 minutes prior to formation of an oxygen plasma. Results listed in Table 8 confirm that UV treatment associated with Ar plasma hardens the photoresist 18 since trim rate decreases as Ar plasma time increases. However, the two stage alternative is not preferred because the etched photoresist profiles are not as vertical as when a combination of Ar and $O_2$ plasma are simultaneously applied. In addition, a lower trim rate can be realized with the combination of Ar and $O_2$ plasma.

TABLE 8

Trim Rate vs. Ar Plasma Time on Unpatterned Wafers in 2 Stage Process

| Process Conditions (Coil = 50 W, Bias = 0, Temp. = 6° C.) | Ar Process Time | Trim Rate (A/min.) |
|---|---|---|
| Step 1: 45 sccm Ar; Step 2: 5 sccm $O_2$ for 3 min. | 3 min. | 486 |
| Step 1: 45 sccm Ar; Step 2: 5 sccm $O_2$ for 3 min. | 6 min. | 443 |
| Step 1: 45 sccm Ar; Step 2: 5 sccm $O_2$ for 3 min. | 7.5 min. | 438 |
| Step 1: 45 sccm Ar; Step 2: 5 sccm $O_2$ for 3 min. | 9 min. | 430 |

Figure 1C:
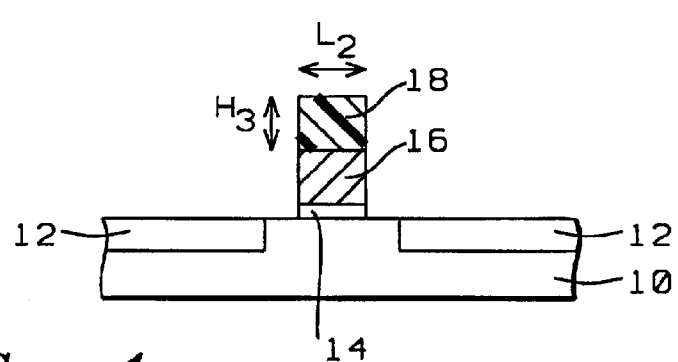

Referring to FIG. 1c, dimension L2 in photoresist 18 is transferred by an etch process into polysilicon layer 16 and oxide layer 14. An etch gas consisting of $Cl_2$, $CCl_4$, or HBr is used to anisotropically etch the polysilicon to form the gate electrode structure. The poly etch recipe is comprised of three parts. First, a breakthrough etch step is performed at 25 mTorr pressure, 400 W power and 30 sccm $CF_4$ for 40 seconds. Then a main etch is applied with the following conditions: 30 Gauss magnetic field; 100 mTorr pressure; 400 W power; 80 sccm HBr; 40 sccm $Cl_2$; and 5 sccm of a $He/O_2$ mixture which is continued to an end point. Finally, a 60 second over etch is performed with a 30 Gauss magnetic field, 80 mTorr pressure, 150 W power, 100 sccm HBr, and 5 sccm of a $He/O_2$ mixture. There is a reduction in vertical size of photoresist 18 from H2 to dimension H3. The top also becomes rounded but conditions can be optimized to reproduce dimension L2 in polysilicon 16. The same etch step or a separate process can be performed to trim gate oxide 14 to dimension L2.

Figure 1D:
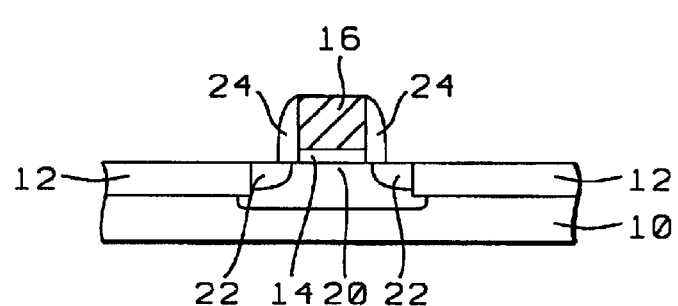

At this point, ion implantation can be used to form source/drain regions. Photoresist 18 is removed by a conventional stripping process. Shallow junctions 22 in FIG. 1d are formed to further define channel 20. Spacers 24 adjacent to polysilicon 16 are also added as part of the final device. The improved method illustrated in FIGS. 1a–1c has enabled a reduced photoresist dimension L2 to be formed that is smaller than the smallest dimension L1 which can be reliably printed in photoresist 18 by a lithographic process. The low temperature condition avoids flow or distortion of the photoresist image that can occur at higher process temperatures. The low temperature and UV hardening combine to provide a horizontal trim rate that is controllable and can reduce a dimension L1 to achieve L2 sizes less than 100 nm. Moreover, high energy ions that can damage the substrate are avoided. The method is a high throughput, low cost process that can be easily implemented in manufacturing lines because it does not require extra layers to be formed and removed and makes use of existing tools.

Optionally, a UV hardening step on photoresist 18 with dimension L1 as shown in FIG. 1a may be done prior to the etch step. This process involves a flood exposure in a commercial tool such as a Fusion M150PC Photostabilizer System from Fusion Systems that is generally available in manufacturing lines. The exposure system can be fitted with different lamps and filters that emit wavelengths in a range from about 200 nm to 500 nm or selected regions therein. Typically, substrate 10 is placed on a chuck inside the exposure chamber. The chuck is rotated during the radiation treatment to provide a uniform exposure across substrate 10. An H-Mod bulb is preferred which produces an intense UV energy between 280 and 300 nm. Several recipes are effective and generally involve heating the substrate from between 100° C. and 240° C. and exposing the substrate for a period of from 1 to 4 minutes. Substrate 10 is then subjected to the plasma etch described previously that trims L1 to dimension L2 in FIG. 1b. Vertical and horizontal etch rates can be obtained similar to those listed in Table 1 and Table 2. UV exposure is performed before the etch is initiated and only the outer skin of photoresist 18 is hardened. The ratio of H2/L2 and H3/L2 may vary depending on the extent of the initial UV hardening step but the same minimum feature size L2 is produced as described earlier.

In a second embodiment, the method of the present invention is used to trim a photoresist feature and simultaneously increase a space width in a pattern that may consist of lines and spaces, contact holes, trenches, or other shapes that are commonly used in lithography. Occasionally, during a lithographic process, it is desirable to print a feature with a space width smaller than its intended size in the mask design. One reason for underexposing to form smaller space widths D1 in FIG. 2a than are in the mask design could be to avoid printing undesirable side lobes in contact hole patterns. Another case for underexposing a photoresist may occur if there are more than one type of feature in a pattern. For example, if line/space combinations are printed at the same time as trenches, the largest common process window for printing the two different features may require one of the two features to be underexposed. This condition will enable a maximum overlap of dose latitude and focus latitude which is necessary in a manufacturing process.

Figure 2A:
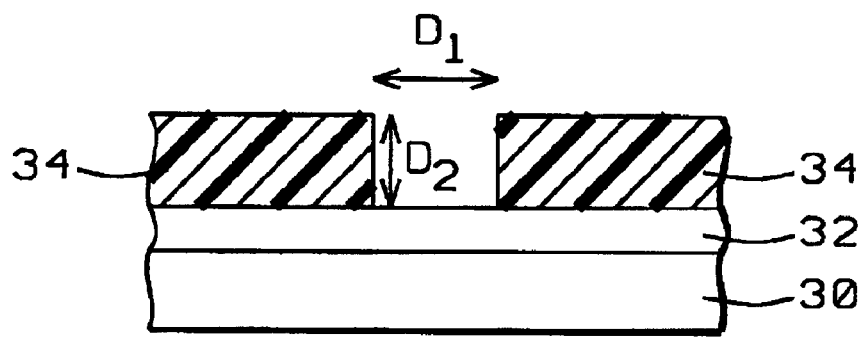
FIGS. 2a–2c are cross sectional views demonstrating how the present invention can be applied to widening a space width in a photoresist pattern followed by etch transfer into an underlying substrate.
Figure 2B:
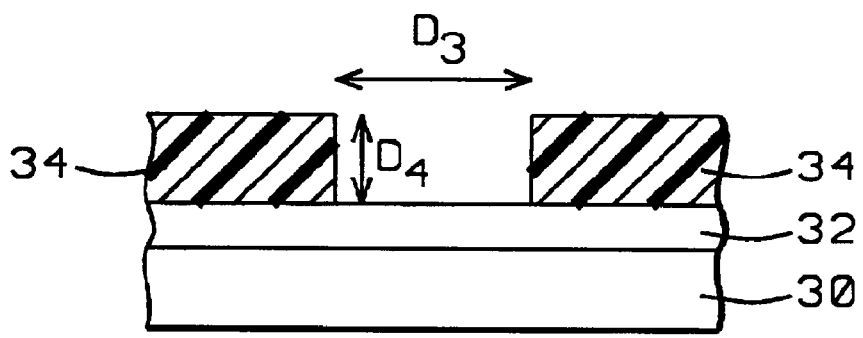
Figure 2C:
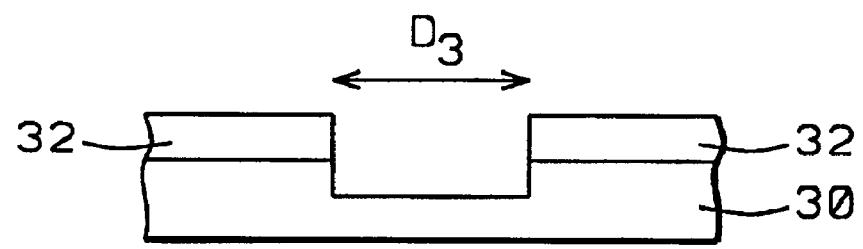

The second embodiment is illustrated in FIGS. 2a–2c. In FIG. 2a a substrate 30 is provided upon which a hard mask 32 is deposited. Substrate 30 may be silicon, SiGe, or other materials that are useful for fabricating integrated circuits in semiconductor or MEMS devices. Hard mask 32 is selected from a group of materials including silicon dioxide, silicon nitride, $SiO_xN_y$, or other inorganic oxides or inorganic nitrides. A photoresist 34 is then coated on hard mask 32 and patterned to form a space width of dimension D1 and height D2. The photoresist can be positive or negative tone, single layer, bilayer, or a top surface imaging material. The exposure system used to form the pattern in photoresist 34 is selected from a group consisting of electron beam, X-ray, EUV, ion beam, and broadband or excimer tools that produce a wavelength or wavelengths in the range of 450 nm to sub-200 nm.

Dimension D1 is smaller than dimension D3 in FIG. 2c which is required to produce the desired performance for the device. Substrate 30 is placed inside an ICP chamber and is etched according to a recipe described in the first embodiment which maintains the substrate temperature at 6.5° C. with an ICP coil power of 50 Watts, an oxygen flow rate of 5 sccm and an argon flow rate of 45 sccm. The etch is timed to provide a trimming of photoresist 34 in a horizontal direction so that space width D3 is achieved as depicted in FIG. 2b. Meanwhile, the height of photoresist 34 is trimmed from D2 to D4. Because the etch is performed at low temperature and the high plasma density results in an intense DUV radiation that hardens photoresist 34, the etch rates can be lowered such that D3 can be produced in a controllable and reproducible manner.

Vertical loss from D2 to D4 is reduced which allows a sufficient film thickness retention to serve as an adequate mask for the subsequent etch transfer into hard mask 32.

Dimension D3 in FIG. 2b is transferred into hard mask 32 in FIG. 2c by employing an appropriate etch chemistry for the particular hard mask. Some etch gas mixtures may rapidly etch photoresist 34 and it is valuable to have sufficient height D4 to protect hard mask 32 in regions under photoresist 34. A combination of low temperature and simultaneous UV hardening affords a larger D4 than attainable with other etch methods. At the point where the etch completely removes hard mask 32 and reaches substrate 30, the etch chemistry is usually changed and the substrate may be moved to another chamber to complete the etch into substrate 30. Layer 32 serves as the mask for etching into substrate 30 and photoresist 34 is either consumed during the etch into substrate 30 or is removed by a stripping process after the etching is complete. FIG. 2c represents the structure with dimension D3 after the etching is finished and the photoresist 34 is removed. Hard mask 32 may remain on the substrate or it may be removed prior to fabricating the next layer in the device.

Therefore, a feature with space width D1 in photoresist 34 can be controllably and reproducibly enlarged to give a space width D3 and then etch transferred into a substrate during the fabrication of an integrated circuit in a microelectronic or MEMS device. The low temperature plasma etch in combination with UV hardening prevents any distortion or flow in photoresist 34 and is a low cost, high throughput process that does not require formation or removal of additional layers. The method can be performed in existing tools and does not damage the substrate with high energy ions. The method is useful when two or more different features are present in a photoresist pattern and at least one of the features is underexposed in order to provide a larger common process window.

Optionally, a UV hardening step of photoresist 34 with space width D1 and height D2 can be performed prior to the ICP etch. The UV hardening is carried out either with a two step trim etch in which an Ar plasma hardening treatment precedes an oxygen plasma trim or by subjecting the substrate 30 to a UV hardening process performed in a commercial tool such as a Fusion M150PC Photostabilizer System. However, the alternative of hardening the photoresist prior to the trim etch is not preferred because the etched photoresist profiles are not as vertical as when a combination of Ar and $O_2$ plasma are simultaneously applied to provide hardening and trimming. In addition, a lower trim rate can be realized with UV hardening occurs at the same time as trim etching.

While this invention has been particularly shown and described with reference to, the preferred embodiments thereof, it will be understood by those skilled in the art that various changes in form and details may be made without departing from the spirit and scope of this invention.

We claim:

1. A method of trimming a linewidth in a photoresist pattern comprising the steps of:
    (a) providing a substrate,
    (b) forming a photoresist pattern on said substrate, and
    (c) exposing the pattern to a low pressure, high density, inductively coupled plasma (ICP) while the substrate is cooled, said plasma generating an intense UV radiation that simultaneously hardens the photoresist as it is etched.

2. The method of claim 1 wherein the photoresist is positive or negative tone and is further characterized as a single layer, bilayer, or top surface imaging system.

3. The method of claim 1 wherein a UV hardening step is inserted after pattern formation and before the etching step, said hardening may be performed with a UV flood exposure tool or in the etch chamber with plasma from an inert gas like argon.

4. The method of claim 1 wherein the substrate is cooled to a temperature less than 20° C. and preferably to 6.5° C.

5. The method of claim 1 wherein the gases in the ICP chamber are oxygen at a flow rate of from 5 sccm to 10 sccm and preferably 5 sccm and argon at a flow rate of from 35 sccm to 65 sccm and preferably 45 sccm.

6. The method of claim 1 wherein the ICP coil power is from 25 Watts to 100 Watts and is preferably 50 Watts and ICP chamber pressure is from about 5 to 10 mTorr.

7. The method of claim 1 wherein a separate bias power can be applied to said substrate, said bias power is in the range of 0 Watts to 100 Watts.

8. The method of claim 1 wherein the linewidth is trimmed to a dimension smaller than 100 nm while the vertical thickness of the photoresist is retained to a sufficient extent to function as a mask for a subsequent etch transfer of the pattern into the substrate.

9. A method of forming a MOSFET comprising the steps of:
(a) providing a substrate having active areas separated by isolation regions, forming a gate oxide on said active areas and depositing a conductive metal layer on said substrate,
(b) forming a photoresist pattern on said conductive metal layer,
(c) trimming the linewidth of said pattern by exposing the substrate to a low pressure, high density, inductively coupled plasma while the substrate is cooled, said plasma generating an intense UV radiation that simultaneously hardens the photoresist as it is etched,
(d) etch transferring the pattern with trimmed linewidth through the underlying conductive metal and gate oxide layers, and
(e) completing the MOSFET by forming source/drain regions, contacts to the source/drain regions and gate electrode, and sidewall spacers on the gate electrode.

10. The method of claim 9 wherein the substrate is silicon and the isolation regions are shallow trench isolation features.

11. The method of claim 9 wherein the photoresist is positive or negative tone and is further characterized as a single layer, bilayer, or top surface imaging system.

12. The method of claim 9 wherein the photoresist has been patterned with radiation selected from a group consisting of ultraviolet with wavelengths in the range of 450 nm to sub-200 nm, electron beam, X-ray, EUV, and ion beam.

13. The method of claim 9 wherein the substrate is cooled to a temperature less than 20° C. and preferably to 6.5° C.

14. The method of claim 9 wherein the gases in the ICP chamber are oxygen at a flow rate of from 5 sccm to 10 sccm and preferably 5 sccm and argon at a flow rate of from 35 sccm to 65 sccm and preferably 45 sccm.

15. The method of claim 9 wherein the ICP coil power is from 25 Watts to 100 Watts and is preferably 50 Watts and the chamber pressure is from about 5 to 10 mTorr.

16. The method of claim 9 wherein a separate bias power can be applied to the wafer, said power is in the range of 0 Watts to 100 Watts.

17. The method of claim 9 wherein the linewidth is trimmed to a dimension as small as 100 nm or less while the vertical thickness of the photoresist is retained sufficiently to function as an adequate mask for step (d).

18. The method of claim 9 wherein a UV hardening step is inserted after pattern formation and before the etching step, said hardening may be performed with a UV flood exposure tool or in the etch chamber with plasma from an inert gas like argon.

19. A method of increasing the space width in a photoresist pattern comprising the steps of:
(a) providing a substrate and a hard mask layer upon said substrate,
(b) forming a photoresist pattern on said substrate, and
(c) increasing the space width of the pattern by exposing to a low pressure, high density, inductively coupled plasma while the substrate is cooled, said plasma generating an intense UV radiation that simultaneously hardens the photoresist as it is etched,
(d) transferring the pattern with increased space width into the underlying hard mask using a plasma etch, and
(e) transferring the pattern in the hard mask into the underlying substrate.

20. The method of claim 19 wherein the hard mask is selected from a group consisting of silicon oxide, silicon nitride, silicon oxynitride, inorganic oxides, and inorganic nitrides.

21. The method of claim 19 wherein the photoresist has been patterned with radiation selected from a group consisting of ultraviolet with wavelengths in the range of 450 nm to sub-200 nm, electron beam, X-ray, EUV, and ion beam.

22. The method of claim 19 wherein the photoresist is positive or negative tone and is further characterized as a single layer, bilayer, or top surface imaging system.

23. The method of claim 19 wherein the pattern consists of lines/spaces, contact holes, trenches or a combination of two or more of the aforesaid features.

24. The method of claim 23 wherein at least one of the said features has been underexposed so that the space width is less than the intended size.

25. The method of claim 19 wherein the substrate is cooled to a temperature less than 20° C. and preferably to 6.5° C.

26. The method of claim 19 wherein gases in the ICP chamber are oxygen at a flow rate of from 5 sccm to 10 sccm and preferably 5 sccm and argon at a flow rate of from 35 sccm to 65 sccm and preferably 45 sccm.

27. The method of claim 19 wherein the ICP coil power is from 25 Watts to 100 Watts and is preferably 50 Watts and the chamber pressure is from about 5 to 10 mTorr.

28. The method of claim 19 wherein a separate bias power can be applied to the wafer, said power is in the range of 0 Watts to 100 Watts.

29. The method of claim 19 wherein the hard mask is replaced with an inorganic or organic bottom anti-reflective coating (BARC) layer.

30. The method of claim 19 wherein the hard mask is omitted and the photoresist serves as the mask for the etch transfer into the underlying substrate.

* * * * *